United States Patent [19]

Berndt

[11] Patent Number: 4,758,983
[45] Date of Patent: Jul. 19, 1988

[54] METHOD AND CIRCUIT ARRANGEMENT FOR CONTENT CONTROLLED ADDRESSING OF A MEMORY

[75] Inventor: Siegward Berndt, Bueren-Ahden, Fed. Rep. of Germany

[73] Assignee: Nixdorf Computer AG, Paderborn, Fed. Rep. of Germany

[21] Appl. No.: 910,889

[22] Filed: Sep. 24, 1986

[30] Foreign Application Priority Data

Oct. 2, 1985 [DE] Fed. Rep. of Germany ....... 3535215

[51] Int. Cl.$^4$ .............................................. G11C 13/00
[52] U.S. Cl. .................................. 365/49; 365/189; 364/200
[58] Field of Search .......................... 365/49, 189, 230; 364/200

[56] References Cited

U.S. PATENT DOCUMENTS 4,656,626 4/1987 Yudichak et al. ..................... 365/49

Primary Examiner—Terrell W. Fears

[57] ABSTRACT

In cooperation with a memory having a plurality of addressable storage locations with sequentially numbered addresses, a method and circuit are provided for content controlled addressing of the memory, in which method and circuit any one of the addresses may be selected as the starting address and subsequent addresses are obtained by adding an addend to the previously used address. The addend may be "one" or some other whole number.

10 Claims, 2 Drawing Sheets

METHOD AND CIRCUIT ARRANGEMENT FOR CONTENT CONTROLLED ADDRESSING OF A MEMORY

The invention concerns a method according to the preamble of claim 1 and a circuit arrangement for carrying out the method.

From U.S. Pat. No. 4,523,301 it is known to create the address value for content controlled addressing of a content addressed memory by means of a counter which produces all possible address values for the entire memory space by the count off at its counting outputs. Such a principle is also useful when switching over from address controlled switching of access because it does not require any special memory construction to suit the associative operation. However, because of time consumption it is practical only with relatively small memories. Known associative memories whose entire memory space can be addressed in an interrogation cycle have therefore been held to correspondingly small size.

If a large memory, for example the main memory of a data processing system, is to be interrogated in a content controlled manner, the previously mentioned known method is basically usable, but not economically.

The object of the invention is to provide a method and a circuit arrangement for content controlled addressing of a memory and making possible its economical application to large memories.

The invention solves this object through the features of claim 1 or claim 5. Advantageous further developments are the substance of dependant claims 2 to 4 or 6 to 8.

By means of the invention it is possible to accomplish content controlled memory access in the case of a data processing system memory which is principally accessed by address control because, without additional memory consumption for associative address values and without the consumption of time for loading additional memories, only an addition process for creating an associative address value is carried out. Beyond that, it is also possible to use this type of address value generation only for a portion of the volume of a relatively large memory, since the beginning address value is appropriately chosen. In many cases, especially in the case of large memories, content controlled access is carried out only in a certain area in the memory. A similar effect on the reduction of the time consumed for content controlled addressing is obtained by the use of a freely selectable predetermined interval between two subsequent address values produced by the added quantities. Namely, a type of content controlled memory access can be desired in which the address values do not select all of the storage places of a memory but instead only select ones which are regularly spaced from one another. The addend which is used for generating the address values can be so chosen that the address values which result from the successively carried out additions are not spaced from one another by the spacing of an address value unit, but are spaced by a larger interval.

The simultaneous use of a limitation on the address volume which is interrogated by content control and the enlargement of the interrogation interval lead naturally to a corresponding increase in the saving of time, especially in the case of large memories.

The invention hereinafter is explained in greater detail in association with the drawings. The drawings are:

Figure 1:
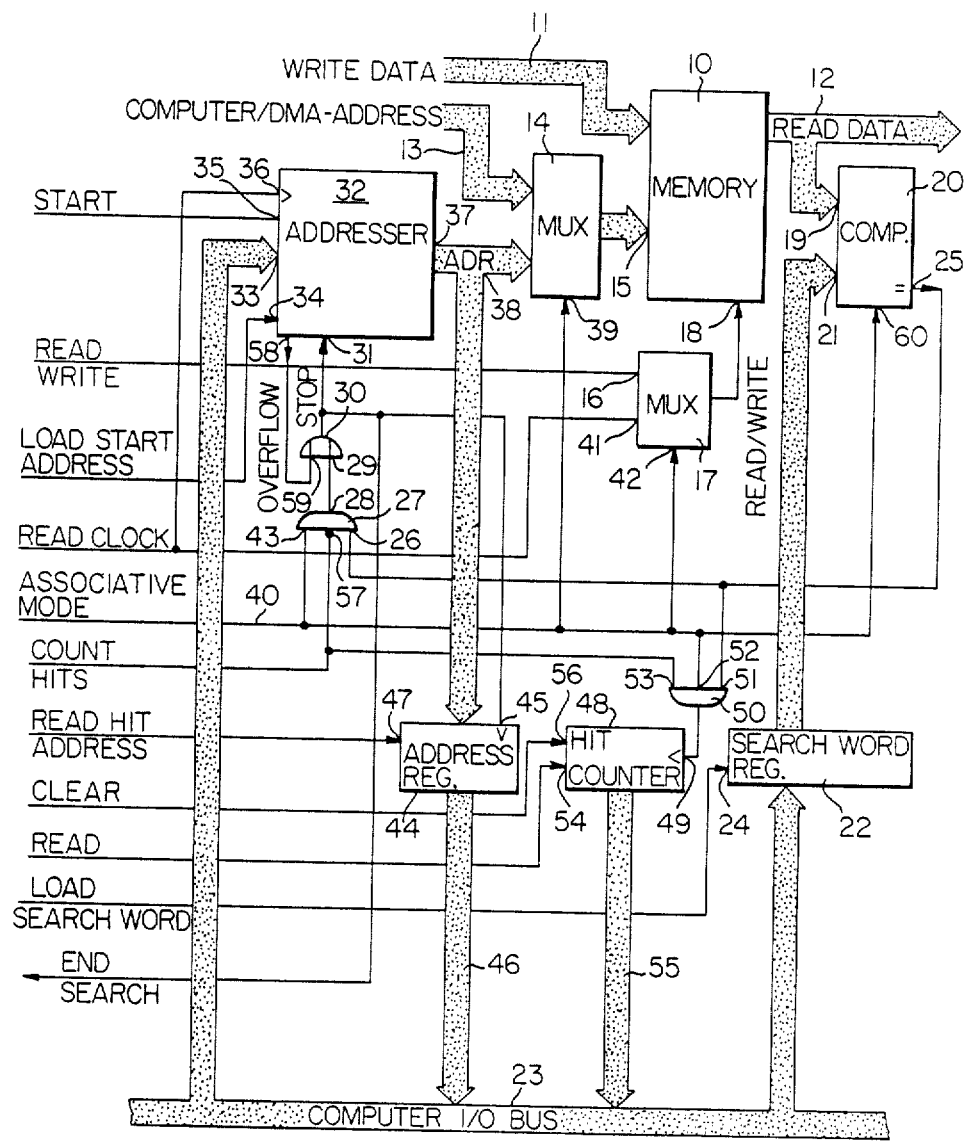
FIG. 1 is a schematic general view of the essential portion of a data processing system comprising one embodiment of the invention and whose memory can be selectively accessed by address control or content control.

The circuit arrangement of FIG. 1 has as essential components a memory 10 which is the main memory of the data processing system and in which data can be written over a data path 11 from a non-illustrated computer or from a computer direct access switch (DMA-Direct Memory Access). Data can be read out of the memory 10 over a second data path 12. This writing and reading takes place with addresses which can be delivered over an address path 13 and which in normal operation are switched to the address inputs 15 of the memory 10 through a first multiplexer 14.

The writing or reading operation of the memory 10 is controlled by a "Read"/"Write" signal which is delivered to the circuit arrangement through an input 16 from the computer associated with the memory 10 or through the DMA within the scope of normal operation. The "Read"/"Write" signal passes to the "Read"/"Write" control input 18 of the memory 10 through a second multiplexer 17.

The second data path 12 for the data read out of the memory 10 is connected to the first inputs 19 of a comparator 20. The second inputs 21 of the comparator 20 are connected with a search word register 22 into which a search word can be input from the I/O bus 23 of the computer. Taking in of the search word by the search word register 22 results from a control command "Load Search word", which is delivered to the circuit arrangement over the corresponding control input 24. The comparator 20 so operates that upon agreement of a search word, which is delivered to the comparator from the register 22 through the inputs 21, with a data word read out of the memory 10, which is delivered to the comparator through the inputs 19, a "Hit" signal will be produced at its output 25. This "Hit" signal is delivered to the first input 26 of an and-gate 27 whose output 28 is connected to an input 29 of an or-gate 30. The output of the or-gate 30 leads to the stop input 31 of an addresser 32.

Generally the addresser, proceeding from a beginning address value, produces a plurality of memory addresses following one another directly or in large steps. The beginning or start address is loaded into the addresser 32 through the load input 33 from the I/O bus 23. The transfer of the start address into the addresser 22 results with the appearance of a control command "Load Start Address" which is delivered to the addresser 32 through a corresponding control input 34. The addresser 32 is started by a "Start" signal from the computer appearing at its start signal input 35.

The address stepping function of the addresser 32 is controlled by a "Read Clock" signal delivered to the addresser at a clock input 36. The address outputs 37 of the addresser 32 are connected with the multiplexer 14 over a further address path 38. When this multiplexer is conditioned by a mode signal 40 at its changeover input 39 to associative operation of the memory 10 the output signals of the addresser 32 are delivered as addresses to the memory 10 through the addresser inputs 15. The "Read Clock" signal is further conveyed to the second input 41 of the second multiplexer 17 whose changeover input 42 is likewise struck by the mode signal 40 so that during the associative operation of the memory 10 the multiplexer 17 is clocked by the "Read Clock" signal.

The mode signal 40 further is conveyed to the second input 43 of and-gate 27 and so controls it that in normal operation a permanent "Stop" signal appears at the output of or-gate 30.

The mode signal 40 is also applied to the enable input 60 of the comparator 20 and so conditions the comparator that a "Hit" signal can appear at its output 25 only during associative operation.

The address outputs 37 of the addresser 32 further can be conveyed over the second address path 38 to an address register 44 which at its load control input 45 is controlled by the "Stop" signal appearing at the output of the or-gate 30. The result of this control is that the information at the address outputs 37 of the addresser 32 are taken into the address register 44 as soon as the addresser 32 is stopped.

The content of the address register 44 can be switched to the I/O bus of the computer over the data path 46 when the computer sends a command signal "Read Hit Address" to the read control input 47 of the address register 44.

The circuit arrangement shown in FIG. 1 includes a hit counter 48 which is controlled at its counting input 49 by the output signal of a second and-gate 50. The first input 51 of this gate has imposed on it the "Hit" signal, that is the signal at the output 25 of the comparator. The second input 52 of the gate 50 is connected with the mode signal 40. The third input 53 can be controlled by the computer with a control signal "Count Hits". At the output of the gate 50 a count pulse is therefore produced when the comparator output 25 indicates a hit, that is: an agreement exists between the memory content and the search word register content, the operation mode is set to "Associative" and the computer has been given the command "Count Hits". The content of the hit counter 48 can, with a computer command "Read Hit Counter", which is applied to a read input 54 of the hit counter 48, be switched to the computer through the I/O bus 23 over a data path 55. The hit counter 48 has a clear input 56 through which it can be set to zero by a computer command "Clear".

The control signal "Count Hits" is also delivered to an inverting input 59 of the first and-gate 27.

When the addresser 32 has run through all addresses which can be created by it, it produces a signal at an overflow output 58 which is conveyed to the second input 59 of the or-gate 30. The logical switching of the gates 27 and 30 at the output of which the "Stop" signal for the addresser 32 appears satisfies the following logical equation:

Stop = Overflow + (Associative mode. Count Hits. Hit)  (1)

When an associative read operation is to be carried out with the circuit arrangement of FIG. 1, the search word is first of all provided on the I/O bus 23 by the computer. Then the computer gives the command "Load Search Word", whereupon the search word is loaded into the search word register 22. In the next step the computer switches the start address onto the I/O bus 23 from which it is loaded into the addresser 32 by the command "Load Start Address" given out by the computer. Then the computer puts out the command "Associative Mode" and starts the addresser 32 by applying the command "Start" to its start signal input 35.

The just loaded start address now stands at the address outputs 37 of the addresser 32 and is applied to the address inputs 15 of the memory 10 through the multiplexer 14 which is switched to the associative mode. The "Read Clock" signal is applied to the read/write control input 18 of the memory 10 through the multiplexer 17 which is likewise switched to the associative mode. The memory 10 thereupon gives to the comparator 20, over the second data path 12, the stored word designated by the start address, in which comparator such stored word is compared with the content of the search word register 22.

Whereas the forward edge of the "Read Clock" signal causes the memory 10 to be read out as described, the rear edge of the signal so switches the clock input 36 of the addresser 32 that at its address outputs the next address appears. The stored word designated by the address appears likewise at the comparator 20 where it is handled in the previously described way. This search routine is repeated until the comparator 20 determines a correspondance between the memory word and the search word and indicates a "Hit" at its output 25. Therewith logical equation (1) is satisified and the addresser 32 is stopped through its stop input 31.

In another operating case of the data processing system it can be of interest to determine how often the search word appears in the memory. In this case the computer outputs the command "Count Hits" which appears at the input 53 of the gate 50. If the search routine now runs off in the manner described above the applicable logical equation for the gate 50 is:

Count Impulse = Associative Mode·Count Hits·Hit  (2)

It is always satisfied when the comparator 20 determines a correspondance between the search word and the memory word. Since logical equation (1) is not satified by a "Hit" the addresser 32 in this case is first stopped when the overflow signal appears.

Figure 2:
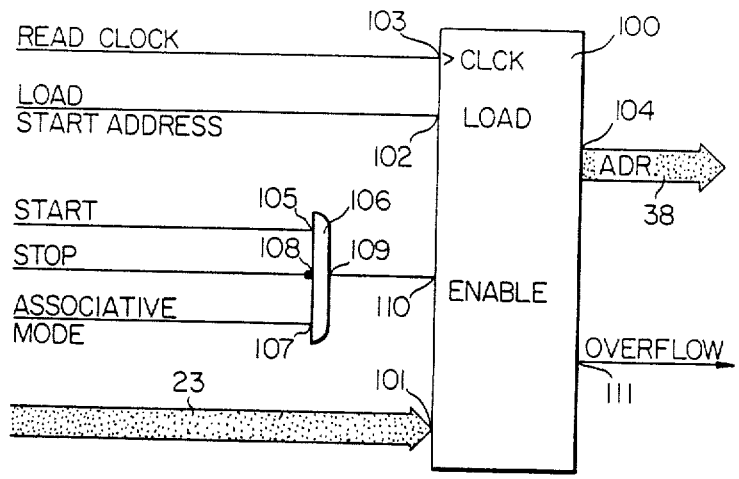
FIG. 2 is a schematic view showing the addresser used in the FIG. 1 system.

In the simplest case the addresser 32 can essentially be made from a commercially available programmable counter such as shown in FIG. 2 and indicated at 100. The start address delivered to the data inputs 101 of the counter 100 from the I/O bus 23 is received into the counter 100 upon the application of the control command "Load Start Address" at the load control input 102. The "Read Clock" is connected to the count input 103. The data outputs 104 of the counter 100 are connected to the second address path 38.

The "Start" signal of the computer is conducted to the first input 105 of an and-gate 106 whose second input 107 is connected to the control command "Associative Mode" line and whose inverting input 108 is connecting to the "Stop" signal. The output 109 of the gate 106 is connected with the count enable input 110. The gate 106 has the logical equation:

Count Enable = Associative Mode·Stop·Start  (3)

The counter therefore, in the associative mode, is started by the "Start" signal and counts, proceeding from the start address, the "Read Clock" signals which appear at its count input 103, which is equilvant to an increase by one of the value appearing at the data output 104. The counting process is continued until the appearance of a "Stop" signal at the input 108 of the gate 106—as a result of which the logical equation (3) is no longer satisfied. The count carry signal obtainable from the output 111 of the counter 100 is useable as the "Overflow" signal.

As already mentioned, in the circuit arrangement of FIG. 2 the associative address appearing at the outputs 104 of the counter 100 is repeatedly increased by one. Often however, it is expedient to produce the successive addresses in larger freely selectable steps. This is possible with an addresser according to FIG. 3.

The I/O bus 23 of the computer is connected to a start register 201 through the data inputs 200 and to other data inputs 202 of an addend register 203. The loading of the start address into the start address register 201 results from the control command "Load Start Address" which is conducted to the register 201 through the load control input 204. The loading of a data word designated "Addend" into the addend register 203 results under the control of a control command "Load Addend" produced by the computer at the load control input 205 of the register 203.

The address outputs 206 of the start address register 201 are connected with the first inputs 207 of a multiplexer 208 whose outputs 209 are connected to first addend inputs 210 of an adder 211. The second addend inputs of the adder 211 are connected with the outputs 213 of further multiplexer 214 whose first inputs 215 are supplied by the outputs 216 of the addend register 203. The second inputs 217 of the multiplexer 214 are connected to zero potential which is equivalent to the data word "0".

The data outputs 218 of the adder 211 are connected to the second address path 38 (FIG. 1) and communicate as well with the data inputs 219 of a summation register 220 whose data output 221 are connected to the second inputs 222 of the multiplexer 208. The load control input 223 of the summation register 220 is connected with the output 224 of an and-gate 225 whose first input 226 is associated with the control command "Associative Mode" and whose second input 227 is associated with the "Read Clock" signal. The logical combination of these two control signals results in the data at the data inputs 219 of the summation register 220 being loaded into the summation register with the rear edge of the "Read Clock" signal, when the control signal "Associative Mode" is active.

The changeover signal input 228 of the multiplexer 208 is so connected with the "Start" signal that when the "Start" signal is active the second inputs 222 of the multiplexer 208 are switched through to the outputs 209. The changeover signal input 229 of the multiplexer 214 is connected with the output 230 of an and-gate 231 whose three inputs are connected to the following signals:

| signals: | |
| --- | --- |
| Input 232: | "Start" Signal |
| Inverting Input 233: | "Stop" Signal |
| Input 234: | "Associative Mode" Signal |

The first inputs 215 of the multiplexer 214 are then switched to its outputs 213 when the following logical equation is satisfied for the gate 231 and therefore for the changeover signal 229 of the multiplexer 214:

Transfer of Addend Register = Start·Associative Mode·Stop    (4)

Figure 3:
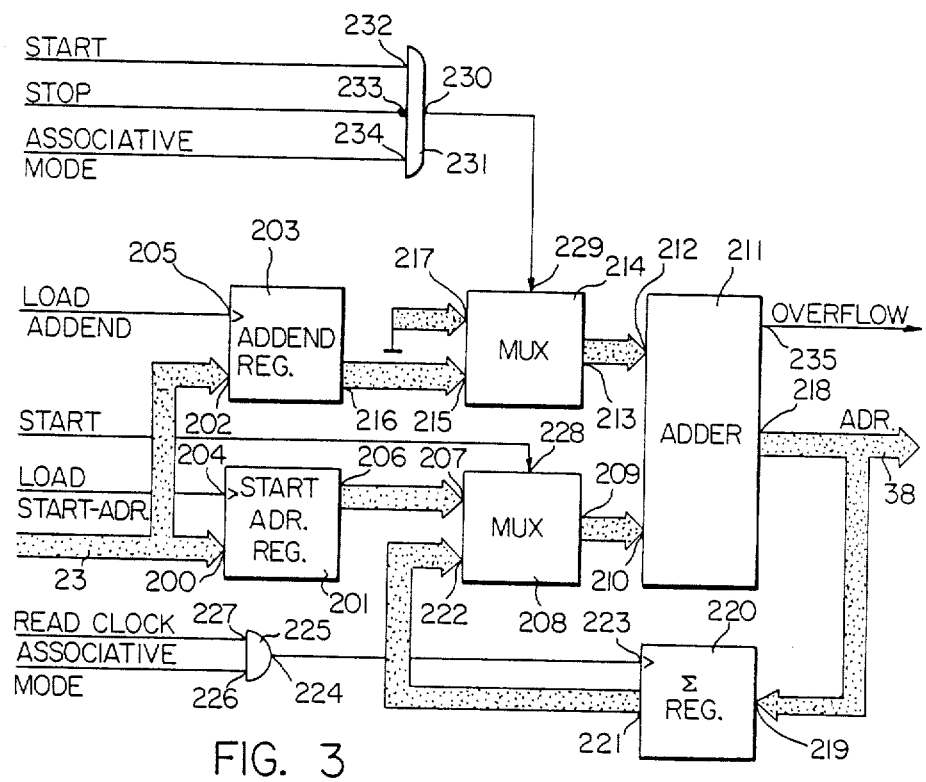
FIG. 3 is a schematic view showing the construction and operation of the addresser of FIG. 2.

The operation of the addresser of FIG. 3 is as follows:

As already described for FIG. 1, after the loading of the search word into the search word register 22 (FIG. 1) the start address is provided by the computer on the I/O bus 23. With the appearance of the control signal "Load Start Address" at the load control input 204 of the start address register 201 the start address is received by that register. In the case of the previously described addressing the next control command given out by the computer is the command "Associative Mode". In the present case however the next following event is the provision of the addend on the I/O bus 23. This quantity is loaded into the addend register 203 upon the production by the computer of the control command "Load Addend" at the load control input 205 of the addend register 203. Now the control command "Associative Mode" is produced by the computer.

Since the "Start" command has not yet been given by the computer, the outputs 206 of the start address register 201 are connected through the multiplexer 208 with the first addend inputs 210 of the adder 211. Further, logical equation (4) is not satisfied, so that the data word "0" is applied to the second addend inputs 212 of the adder 211. Therefore, the start address appears at the outputs 218 of the adder 211 and also at the address inputs 15 of the memory 10 (FIG. 1). The data word in the memory 10 designated by the start address is therefore compared as first described with the content of the search word register 22 (FIG. 1). With the next following "Read Clock" signal the start address is also loaded into the summation register 220.

If the "Start" command is now given out by the computer the multiplexer 208 is so conditioned through its changeover signal input 228 that the outputs 221 of the summation register 220 are connected to the first addend inputs 210 of the adder 211. With the activation of the "Start" command, equation (4) is also satisfied, with the result that the multiplexer 214 connects the outputs 216 of the addend register 203 to the second addend inputs 212 of the adder 211. At the outputs 218 of the adder 211 there now appears an address word for the memory 10 (FIG. 1) having the value "Start Address+Addend". This is also loaded as described into the summation register 220. After the next read clock the address at the outputs 218 of the adder 211 has the value "Start Address+2×Addend".

At a carry output 235 of the adder 211 the "Overflow" signal appears when the adder 211 has given out the highest address which it can represent. This happens if the search word is not found in the memory 10 or if the circuit arrangement of FIG. 1 is set to the mode "Count Hits".

Upon the appearance of a "Hit" signal, or of the "Overflow" signal, equation (1) is satisfied and the "Stop" signal is produced as described above. At this time equation (4) is no longer satisfied with the result that the data word "0" applied to the second inputs 217 of the multiplexer 214 is again switched to the second inputs 212 of the adder 211. The address value at the outputs 218 of the adder 211 no longer changes. Upon the cancellation of the control command "Associative Mode" by the computer this circuit arrangement is completely shut down.

It still remains to be mentioned that in all circuit variations the associative mode can be interrupted by cancellation of the control command "Associated Mode" and can be thereafter reinstated and continued at and from the last searched address. Therefore, a direct memory access (DMA) from outside is possible at any time. It is also possible, with the circuit arrangement of FIG. 1 to permit the simultaneous working of several programs, since during the processing of one command of one program the memory of the data processing system (here the memory 10) can be driven in the associative mode for another program.

I claim:

1. A method for content controlled addressing of a memory, said method comprising the steps of providing a memory having a plurality of addressable storage locations, each of said storage locations being capable of storing a data word and having asociated with it a unique address number with the set of address numbers associated with said plurality of storage locations being one in which the address numbers are a sequence of numbers wherein each number is larger than the preceeding numbers as a starting address number, addressing said memory with said starting address number, providing an addend value, adding said addend value to said starting address number to provide a new address number, addressing said memory with said new address number, and then continuing the sequential addressing of said memory by sequentially using new address numbers each obtained by adding said addend value to the previously used address number.

2. A method according to claim 1 further characterized by establishing a predetermined address range, and interrupting said step of momentary new address number is the highest new address number falling within next predetermined address range.

3. A method according to claim 1 further characterized by said step of interrupting the continued addressing of said memory being accomplished by changing said addend value to "0".

4. A method according to claim 1 further characterized by providing a search word, upon each addressing of said memory comparing the data word stored at the addressed storage location with said search word, and interrupting further addressing of said memory in the event the result of such comparision is that the compared data word equals said seach word.

5. A method according to claim 4 further characterized by said step of interrupting further addressing of said memory being accomplished by changing said addend value to "0".

6. A method according to claim 1 further characterized by said memory being one wherein the data word stored at an addressed storage location is read out of said memory upon the appearance of a "Read" clock pulse at a read control terminal, providing a plurality of "Read" pulses for reading said memory, and upon the rear edge of each of said "Read" pulses performing said steps of adding said addend value to obtain a new address number and addressing said memory with said new address number.

7. A circuit for content controlled addressing of a memory, said circuit comprising:

a memory having a plurality of addressable storage locations, each of which storage locations is capable of storing a data word and has associated with it a unique address number with the set of address nubmers associated with said plurality of storage locations being one wherein the address numbers are a sequence of numbers wherein each number is larger than the preceding one by a unit value, a memory addressing register, an adder having output terminals connected to said memory addressing register for supplying its output to said register as an address number, said adder also having a set of first addend input terminals and a set of second addend input terminals, a start address register connected to said first addend input terminals of said adder for supplying a start address number to said adder, an addend input register connected to said second addend input terminals of said adder for supplying an addend to said adder, and means for first addressing said memory by supplying said start address from said start address register to said adder and then from said adder to said memory addressing register and for then sequentially addressing of said memory by after each addressing causing said adder to add said addend from said addend register to the last used address number to produce a new address number supplied to said memory addressing register.

8. A circuit as described in claim 7 further characterized by a summation register connected to the output terminals of said adder for holding address numbers outputted by said adder, and means for switching said summation register to said first addend terminals of said adder in place of said start address register.

9. A circuit as described in claims 8 further characterized by said addend register being connected to said second set of addend terminals through a multiplexer, said multiplexer having two groups of input terminals, one of said groups of input terminals being connected to said addend register and the other of said groups of said groups of input terminals being connected to zero potential.

10. A circuit as described in claim 8 further characterized by said memory having a read control terminal, means for applyiing "Read" pulses to said read control terminal and said summation register being controlled by said "Read" pulses.

* * * * *